United States Patent
Zhu et al.

(10) Patent No.: US 9,319,060 B2
(45) Date of Patent: Apr. 19, 2016

(54) FREQUENCY RESPONSE COMPENSATION IN A DIGITAL TO ANALOG CONVERTER

(71) Applicant: Lattice Semiconductor Corporation, Portland, OR (US)

(72) Inventors: Jiabing Zhu, Shanghai (CN); Yibin Fu, Shanghai (CN)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/391,382

(22) PCT Filed: Jul. 17, 2014

(86) PCT No.: PCT/CN2014/082387
§ 371 (c)(1),
(2) Date: Oct. 8, 2014

(65) Prior Publication Data
US 2016/0020779 A1    Jan. 21, 2016

(51) Int. Cl.
*H03M 1/66* (2006.01)
*H03M 1/68* (2006.01)

(52) U.S. Cl.
CPC .............. *H03M 1/66* (2013.01); *H03M 1/662* (2013.01); *H03M 1/68* (2013.01)

(58) Field of Classification Search
CPC .......... H03M 1/66; H03M 1/662; H03M 1/68
USPC ........................................ 341/144, 120, 145
See application file for complete search history.

(56) References Cited

U.S. PATENT DOCUMENTS

| 6,466,143 B2* | 10/2002 | Eshraghi | H03M 3/372 341/143 |
| 6,778,116 B1* | 8/2004 | Skones | H03M 3/502 341/144 |
| 7,994,957 B2* | 8/2011 | O'Donnell | H03M 1/0836 341/144 |
| 2002/0075174 A1 | 6/2002 | Volk | |
| 2005/0225464 A1 | 10/2005 | Lin et al. | |

FOREIGN PATENT DOCUMENTS

| CN | 1742434 A | 3/2006 |
| CN | 101221714 A | 7/2008 |
| CN | 103023506 A | 4/2013 |

OTHER PUBLICATIONS

PCT International Search Report and Written Opinion, PCT Application No. PCT/CN2014/082387, Mar. 27, 2015, 11 pages.

(Continued)

*Primary Examiner* — Brian Young
(74) *Attorney, Agent, or Firm* — Fenwick & West LLP

(57) ABSTRACT

A digital-analog converter (DAC) comprises a receiving circuit configured to receive an input bit stream and generate a first bit signal stream of the input bit stream, a first delay circuit coupled to the receiving circuit to receive the first bit signal stream and to generate a second bit signal stream representing a delayed version of the first bit signal stream. The DAC also comprises a first current generation circuit to receive the first bit signal stream, the first current generation circuit configured to provide first current, corresponding to the first bit signal stream, to a first output. The DAC further comprises a second current generation circuit to receive the second bit signal stream and to provide second current to the first output responsive to receiving the second bit signal stream, a waveform of the second current inverted and scaled relative to a waveform of the first current.

20 Claims, 11 Drawing Sheets

(56) References Cited

OTHER PUBLICATIONS

Gu, R. et al., "A 0.5-3.5 Gb/s Low-Power Low-Jitter Serial Data CMOS Transceiver," 1999 IEEE International Solid-State Circuits Conference, Digest of Technical Papers. ISSCC, 1999, pp. 352-353 478.

* cited by examiner

FREQUENCY RESPONSE COMPENSATION IN A DIGITAL TO ANALOG CONVERTER

TECHNICAL FIELD

The disclosed embodiments relate generally to a digital to analog converter, and more specifically to performing frequency response compensation in a digital to analog converter.

BACKGROUND

The frequency response of a digital to analog converter (DAC) is characterized by a low pass filter response, and rolls off according to the sinc frequency-response envelope at high frequencies. This results in an attenuation of higher frequency signal components such as image frequencies as well as higher frequency content of the desired in-band signals. In some instances, due to the high frequency roll off, at Nyquist frequency ($F_{NYQUIST}=f_s/2$), the DAC frequency response may be attenuated by as much as 3.92 dB. At a frequency of $f_s/3$, the frequency response may be attenuated by as much as 1.65 dB. For some applications, such as broadband wireless communication, this non-flat response could have an undesired impact on system performance. Various techniques used to compensate for the sinc attenuation observed in a DAC's frequency response include increasing the DAC's input updating rate or sampling frequency or adding a digital or analog high pass filter respectively along the digital or analog signal paths. However, these techniques are encumbered with challenges—for example, increasing the DAC's input updating rate can be limited by the DAC's maximum conversion speed and increased power consumption or increased complexity of digital or analog design.

SUMMARY

Embodiments relate to an n-bit digital to analog converter (DAC) including a receiving circuit, a first delay circuit, a first current generation circuit and a second current generation circuit. The receiving circuit receives an input bit stream and generates a first bit signal stream of the input bit stream corresponding to bit values of the input bit stream at a time. The first delay circuit is coupled to the receiving circuit and receives the first bit signal stream. The delay circuit generates a second bit signal stream representing a version of the first bit signal stream delayed by a first period of time. The first current generation circuit coupled to the receiving circuit to receive the first bit signal stream. The first current generation circuit provides first current to a first output responsive to receiving the first bit signal stream. The first current corresponds to the first bit signal stream. The second current generation circuit is coupled to the delay circuit and receives the second bit signal stream. The second current generation circuit provides second current to the first output responsive to receiving the second bit signal stream. The waveform of the second current inverted and scaled relative to a waveform of the first current.

In one or more embodiments, the waveform of the second current lags the waveform of the first current by the first period of time.

In one or more embodiments, the receiving circuit includes a first set of n memory elements. Each memory element of the first set receives and stores a bit value in one of n sub-streams of the input bit stream. The first delay circuit includes a second set of n memory elements. Each memory element of the second set is coupled to a corresponding memory element of the first set to receive and store a bit value in one of n sub-streams of the first bit signal stream.

In one or more embodiments, the first current generation circuit includes a first set of n current sources and a first set of n switches. Each current source of the first set of current sources is coupled to the first output via a corresponding switch of the first set of switches, the corresponding switch is turned on or off responsive to the bit value in one of n sub-streams of the first bit signal stream.

In one or more embodiments, the second current generation circuit includes a second set of n current sources and a second set of n switches. Each current source of the second set of current sources is coupled to the first output via a corresponding switch of the second set of switches, the corresponding switch is turned on or off responsive to the bit value in one of n sub-streams of the second bit signal.

In one or more embodiments, one or more additional delay circuits is coupled to the first delay circuit and is configured to generate a third bit signal stream representing a version of the first bit signal stream delayed relative to the input bit stream by a second period of time that is greater than the first period of time. One or more corresponding additional current generation circuits is coupled to the one or more additional delay circuits to receive the third bit signal stream and to provide a third current to the first output responsive to receiving the third bit signal stream, a waveform of the third current scaled relative to a waveform of the first current.

In one or more embodiments, the n-bit DAC additionally includes a second output to receive a third current from the first current generation circuit and a fourth current from the second current generation circuit, a current at the second output in conjunction with a current at the first output forming a differential signal.

In one or more embodiments, the waveform of the second current is up-scaled relative to the waveform of the first current.

In one or more embodiments, the waveform of the second current is down-scaled relative to the waveform of the first current.

Embodiments also relate to a method of operating an n-bit digital to analog converter. An input bit stream is received. A first bit signal stream of the input bit stream corresponding to bit values of the input bit stream at a time is generated. A second bit signal stream representing a version of the first bit signal stream delayed by a first period of time is generated. First current is provided to a first output based on the first bit signal stream. The first current corresponds to the first bit signal stream. Second current is provided to the first output based on the second bit signal stream. The waveform of the second current is inverted and scaled relative to a waveform of the first current.

DESCRIPTION OF EMBODIMENTS

Reference will now be made in detail to various embodiments, examples of which are illustrated in the accompanying drawings. In the following detailed description, numerous specific details are set forth in order to provide a thorough understanding of the invention and the described embodiments. However, the invention may be practiced without these specific details. In other instances, well-known methods, procedures, components, and circuits have not been described in detail so as not to unnecessarily obscure aspects of the embodiments.

Embodiments related to compensating for a low-pass frequency response of a digital to analog converter (DAC) by using high pass filter architecture. The high pass filter architecture compensates for the high frequency attenuation caused by the low-pass frequency response of the DAC. An output signal corresponding to an input digital bit stream is generated to enforce or amplify the high frequency content associated with rising or falling edges in the input digital bit stream by reducing a representation of the input bit stream by a delayed and scaled version of the same input bit stream.

Figure 1A:
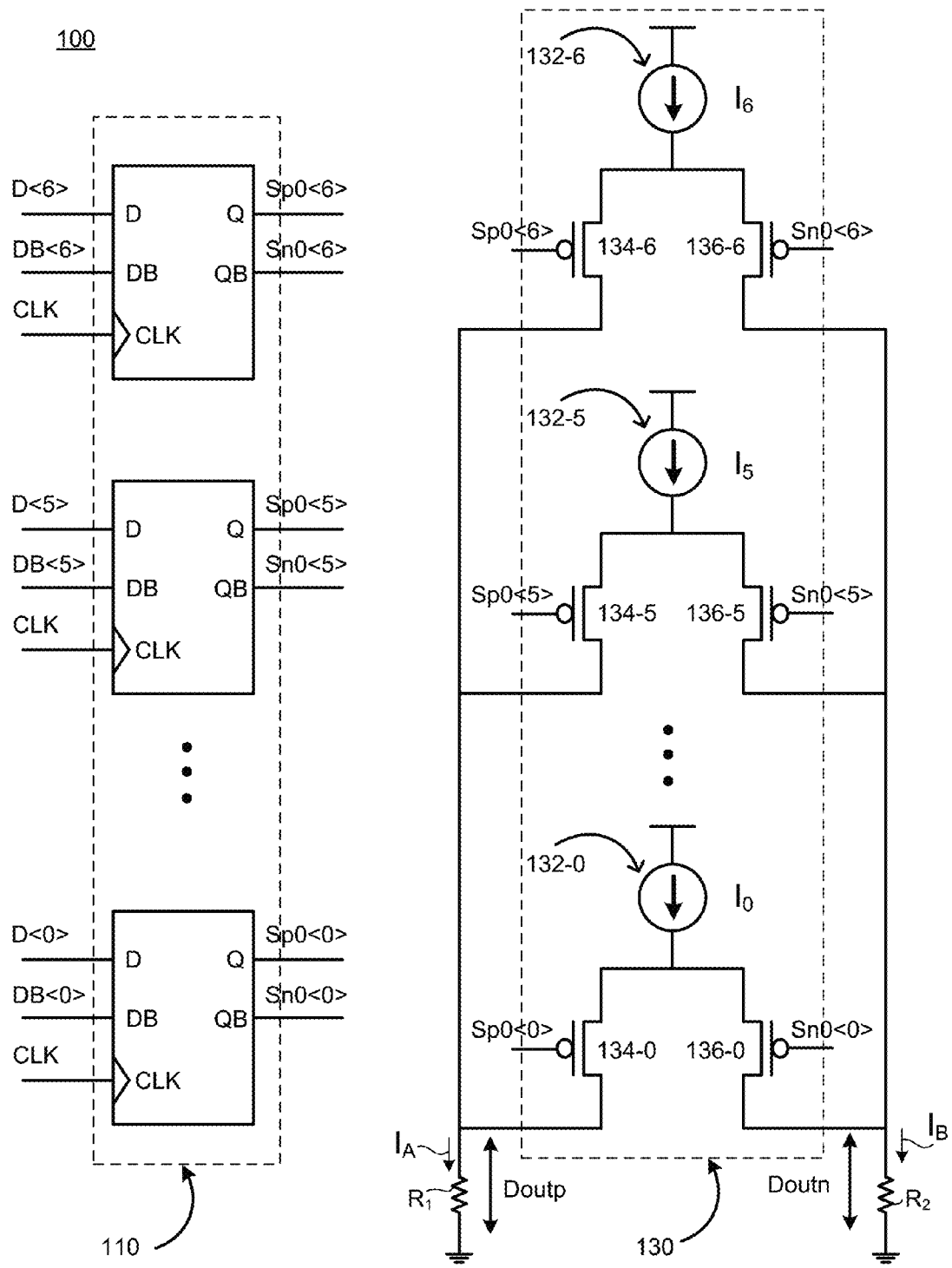
FIG. 1A is a circuit schematic of a current steering digital to analog converter.

FIG. 1A is a circuit schematic of a current steering digital to analog converter (DAC) 100, according to one embodiment. The n-bit current steering DAC 100 receives a digital input bit stream. The digital input bit stream comprises n parallel sub-streams. The n-parallel sub-streams may be obtained from a single bit stream using a serial to parallel converter. In the example of FIG. 1A, n=7 corresponding to the seven parallel sub-streams D<0>, D<1>, . . . , D<6>. Although illustrated in FIG. 1A as receiving a bit stream with seven parallel bit sub-stream, current steering DAC 100 can be configured to receive a digital input bit stream having any number (n) of bit sub-streams. Current steering DAC 100 produces an analog output corresponding to the digital input bit stream. The analog output is produced at a first output Doutp, at a second output Doutn, or as a differential signal between the first output and the second output Doutp−Doutn.

As shown in FIG. 1A, an n-bit current steering DAC 100 includes a receiving circuit 110, which in turn may include a set of n memory elements (e.g., a series of n differential flip-flops). Current steering DAC 100 further includes a current generation circuit 130 coupled to the receiving circuit 110.

The receiving circuit 110 receives the input bit stream. For example, each memory element (e.g., flip-flop) receives a corresponding sub-stream of the seven sub-streams D<0>, D<1>, . . . , D<6>. The receiving circuit 110 generates a first bit signal stream (e.g., Sp0<0>, Sp0<1>, . . . , Sp0<6> and/or a complementary version thereof Sn0<0>, Sn0<1>, . . . , Sn0<6>) of the input bit stream corresponding to bit values of the input bit stream at a time. For example, first bit signal stream values Sp0<0>, Sp0<1>, . . . , Sp0<6> correspond to values of the input bit stream D<0>, D<1>, . . . , D<6>, respectively, sampled at a specified instance of a sampling clock CLK (e.g., sampled at every rising edge of the sampling clock CLK).

The current generation circuit 130 may include a set of n current sources 132-0 through 132-5 (hereinafter collectively referred to as "current sources 132") and a first set of n switches 134-0 through 134-5 (hereinafter collectively referred to as "switches 134"). The current generation circuit 130 receives the first bit signal stream from the receiving circuit 110. For example, a corresponding switch of the first set of n switches is turned on or off responsive to the bit value in one of n sub-streams of the first bit signal stream. For example, switch 134-0 is turned on or off based on a bit value of Sp0<0>, switch 134-4 is turned on or off based on a bit value of Sp0<4>, and so on.

Each of current sources 132 is coupled to the first output (Doutp) via a corresponding switch of the first set of switches 134. Each current source of the first set of n current sources 134 provides a specified (e.g., predefined) value of current $I_0$ through $I_6$ to its output when a corresponding switch is turned on. Current values of consecutive current sources ($I_0$ and $I_1$, $I_1$ and $I_2$, . . . , and so on) have binary relationships. In other words, if $I_0$ is a current value for current source 132-0 corresponding to a least significant bit stream (D<0> or Sp0<0>) of the DAC, then current value $I_1=2^1*I_0=2*I_0$ for the subsequent bit sub-stream of the DAC, . . . , current value $I_5=2^5*I_0=32*I_0$, current value $I_6=2^6*I_0=64*I_0$, and so on. In general, current value $I_n$ for a $n^{th}$ bit of the DAC would be $I_n=2^n*I_0$.

The current generation circuit 130 provides first current $I_A$ to a first output (e.g., Doutp) responsive to receiving the first bit signal stream, the first current corresponding to the first bit signal stream. The first current is generated by a superposition or summation of one or more of the current values provided correspondingly by one or more of the current sources of the first set of current sources responsive to a corresponding switch of the first set of n switches being turned on, based on the first bit signal stream. For example, for the first bit signal stream 1011011 (corresponding to Sp0<0>, Sp0<1>, . . . , Sp0<6>), the first current (I) to the first output (e.g., Doutp) is obtained, for this bit stream, as described in equations (1) through (3):

$$I=1\times I_0+0\times I_1+1\times I_2+1\times I_3+0\times I_4+1\times I_5+1\times I_6 \quad (1)$$

$$I=I_0+0+4\times I_0+8\times I_0+0+32\times I_0+64\times I_0 \quad (2)$$

$$I=109\times I_0 \quad (3)$$

Note that although FIG. 1A illustrates, for the sake of completeness, that the first current $I_A$ results from a superposition of currents from each of the current sources 134-0 through 134-5, in practice and as described above, the first current is generated by a superposition of currents corresponding only to the switches 134 that are turned on.

As illustrated in FIG. 1A, the current steering DAC 100 further comprises a second output (e.g., Doutn) to receive a second current $I_B$ from the current generation circuit 130. The current at the second output in conjunction with the current at the first output may form a differential signal (e.g., Doutp−Doutn).

FIGS. 1B through 1F are timing waveforms and frequency response plots of digital to analog converters. The frequency response for a DAC, for example, as illustrated in FIG. 1A rolls off according to the sinc frequency-response envelope as described below.

Figure 1B:
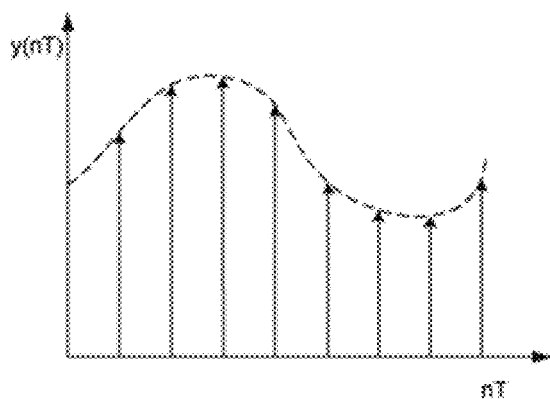
FIGS. 1B through 1F are timing waveforms and frequency response plots illustrating operating principles of digital to analog converters.
Figure 1C:
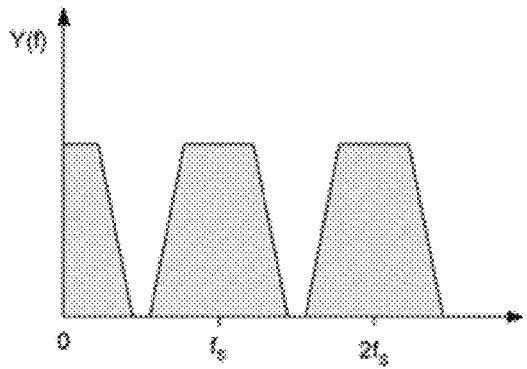

FIG. 1B illustrates a time domain representation of an input signal to be provided to a DAC (such as the DAC 100 illustrated in FIG. 1A) as a train of impulses in time domain. The impulses have magnitude y(nT) corresponding to time instances nT, where T is a sampling interval. FIG. 1C illustrates the frequency spectrum in the frequency domain corresponding to the input signal or pulse train (FIG. 1B); Y(f) represents magnitude values of the frequency response plot at the various frequencies (f) where $f_s$ corresponds to the DAC's input data updating frequency.

Figure 1D:
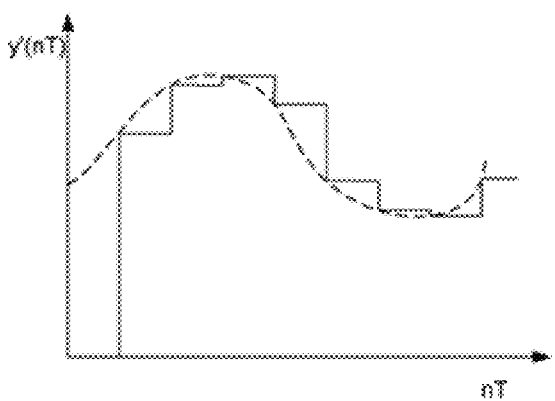
Figure 1E:
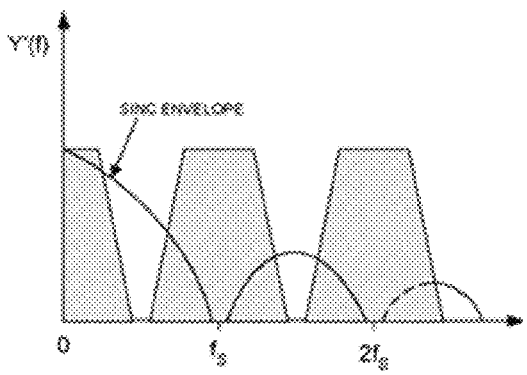

FIG. 1D illustrates a time domain representation of the output of a DAC (such as the DAC 100 illustrated in FIG. 1A) to the input signal of FIG. 1B. The DAC functions as a "zero-order hold" that holds the voltage constant for an update period (e.g., a period of $1/f_s$). The DAC's output has magnitude values y'(nT) corresponding to time instances nT, where T is a sampling interval. In the frequency domain, as shown in FIG. 1E, this zero-order hold introduces sinc distortion (also referred to as aperture distortion). In other words, as shown in the frequency domain representation of FIG. 1E, the amplitude of the DAC output signal spectrum is multiplied by a |sin(x)/x| function (a sinc envelope), where $x=\pi f/f_s$ and $f_s$ is DAC's input data updating frequency, f is a frequency in Hertz and x is a normalized frequency in radians/second. Y'(f) represents magnitude values of the frequency response plot at the various frequencies (f) where $f_s$ corresponds to the DAC's input data updating frequency. The resulting frequency response H(f) is illustrated in FIG. 1F and is governed by equation (4):

$$H(f)=\sin(\pi f/f_s)/(\pi f/f_s) \quad (4)$$

Figure 1F:
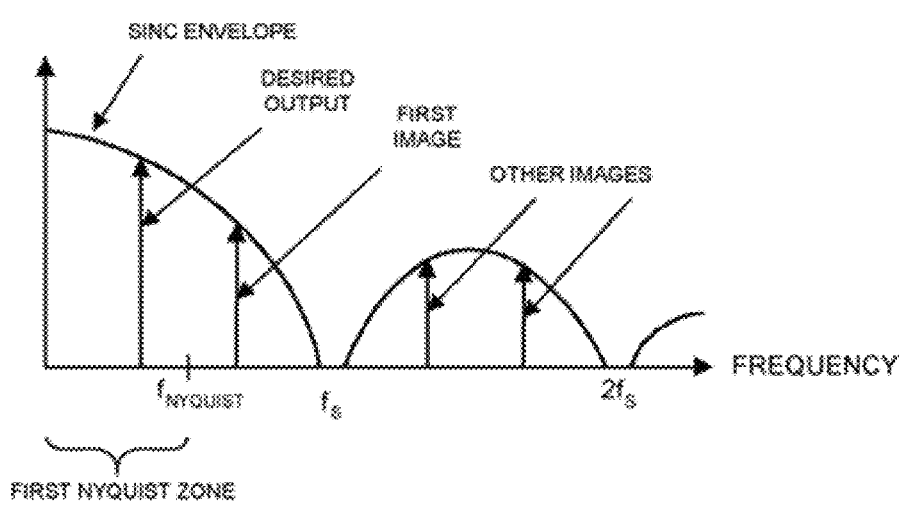

As seen from the frequency response plot in FIG. 1F, aperture distortion acts like a low pass filter and causes the higher signal frequencies to be attenuated. For example, the low pass filter response causes image frequencies and also the desired in-band signal frequencies to be attenuated. For instance, at Nyquist frequency ($F_{NYQUIST}=f_s/2$), the DAC frequency response is attenuated by 3.92 dB; at a frequency of $f_s/3$, the frequency response is attenuated by 1.65 dB. For some applications, such as broadband wireless communication, this non-flat response could have an undesired impact on system performance.

Figure 2A:
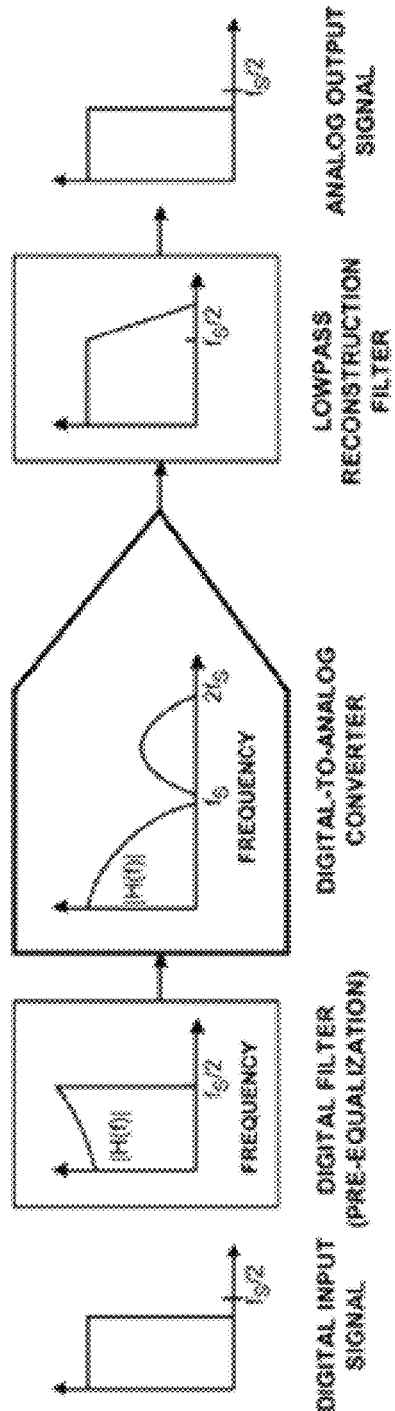
FIGS. 2A and 2B are block diagrams illustrating compensation for the frequency responses of conventional digital to analog converters.
Figure 2B:
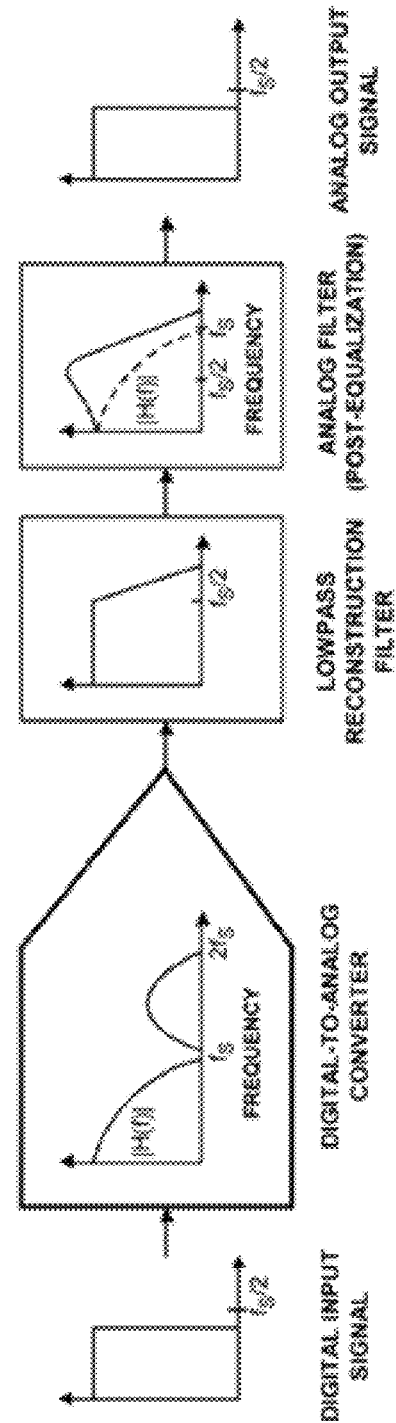

FIGS. 2A and 2B are block diagrams illustrating compensating for the frequency responses of conventional digital to analog converters, according to one embodiment. Various techniques are used to compensate for the sinc attenuation observed in a DAC's frequency response. One of these techniques includes increasing the DAC's input updating rate or sampling frequency. However, increasing the DAC's input updating rate can be limited by the DAC's maximum conversion speed and can result in an increase in power consumption.

Another approach to compensate for the high frequency attenuation, is adding a high pass filter along the signal path. For example, a digital domain pre-equalizer may be placed before the DAC along a signal path (as shown in FIG. 2A). However, a pre-equalizer, when added in the digital domain, necessitates more complex digital processing. Similarly, an analog domain post-equalizer may be placed after DAC along the signal path (as shown in FIG. 2B). But the post-equalizer in the analog domain frequently reduces signal to noise ratio and increases area cost.

Figure 3:
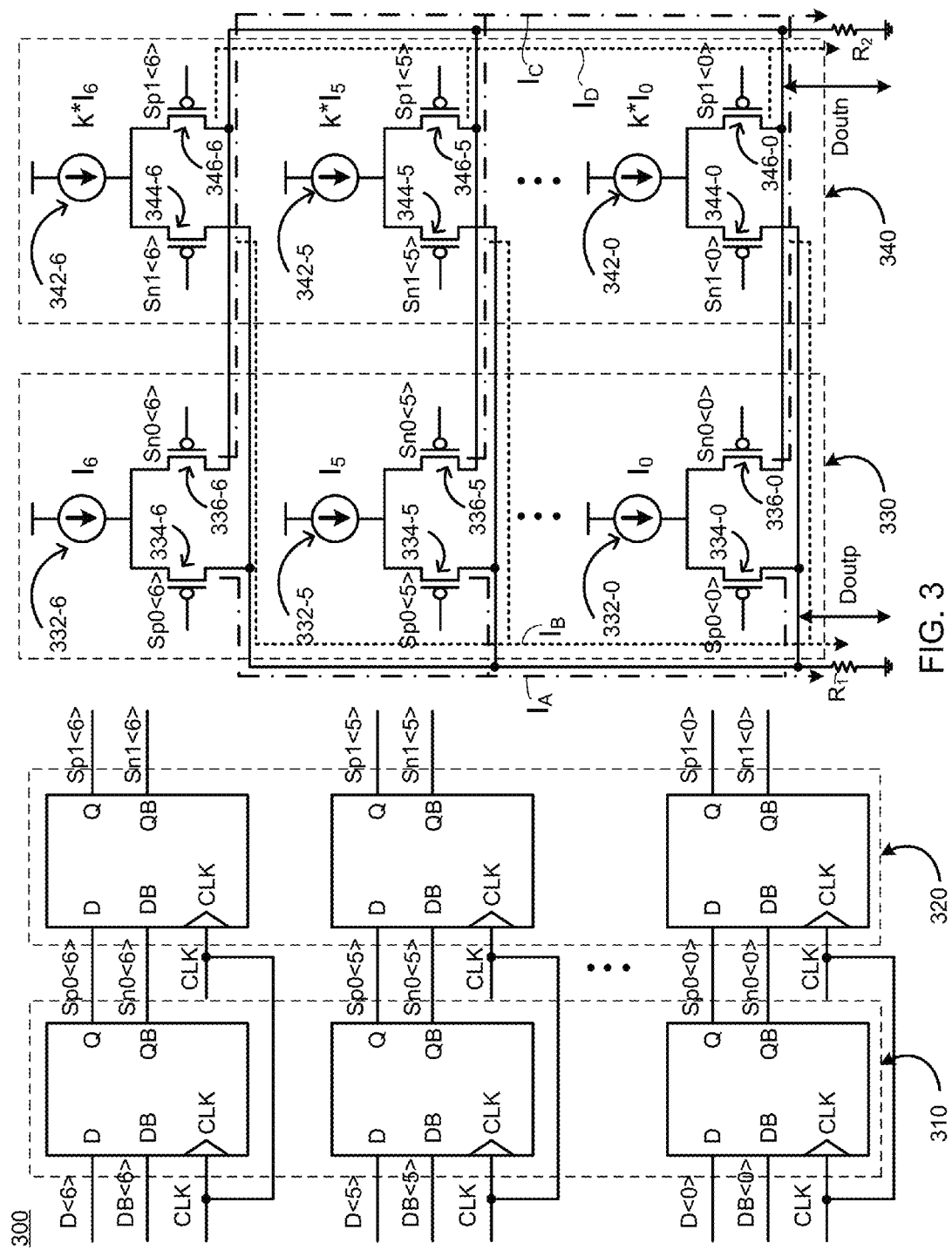
FIG. 3 is a circuit schematic illustrating one a current steering digital to analog converter with frequency response compensation, according to one embodiment.

FIG. 3 is a circuit schematic illustrating a current steering digital to analog converter with frequency response compensation, according to one embodiment. As shown in FIG. 3, the n-bit digital to analog converter 300 includes a receiving circuit 310 and a first current generation circuit 330.

For instance, as described above with reference to the receiving circuit 110 of FIG. 1A, the receiving circuit 310 of FIG. 3 receives an input bit stream D<0>, D<1>, . . . , D<6> and generates a first bit signal stream (e.g., Sp0<0>, Sp0<1>, . . . , Sp0<6> and/or a complementary version thereof Sn0<0>, Sn0<1>, . . . , Sn0<6>) of the input bit stream corresponding to bit values of the input bit stream at a time. The first bit signal stream values correspond to respective values of the input bit stream sampled at a specified instance of a sampling clock CLK (e.g., sampled at every rising edge of the sampling clock CLK). In some embodiments, the receiving circuit 310 includes a first set of n memory elements (e.g., a parallel series of flip-flops). Each memory element of the first set receives and stores a bit value in one of n sub-streams of the input bit stream.

The n-bit digital to analog converter 300 further comprises a first current generation circuit 330 coupled to the receiving circuit 310 to receive the first bit signal stream (e.g., Sp0<0>, Sp0<1>, . . . , Sp0<6> and/or a complementary version thereof Sn0<0>, Sn0<1>, . . . , Sn0<6>). The first current generation circuit 330 is configured to provide first current $I_A$ to a first output (e.g., Doutp) responsive to receiving the first bit signal stream, the first current corresponding to the first bit signal stream. To this end, in some embodiments, the first current generation circuit 330 comprises a first set of n current sources 332-0, through 332-6 (hereinafter collectively referred to as "current sources 332") and a first set of n switches 334-0 through 334-6 (hereinafter collectively referred to as "switches 334"). Each current source of the first set of current sources 332 is coupled to the first output (e.g., Doutp) via a corresponding switch of the first set of switches 334, the corresponding switch is turned on or off responsive to the bit value in one of n sub-streams of the first bit signal stream. For example, switch 334-0 is turned on or off based on bit sub-stream Sp0<0>, . . . , switch 334-5 is turned on or off based on bit sub-stream Sp0<5>, and so on. As noted above with reference to FIG. 1A, although FIG. 3 illustrates, for the sake of completeness, that the first current $I_A$ results from a superposition of currents from each of the current sources 334-0 through 334-5, in practice and as described above, the first current is generated by a superposition of currents corresponding only to the switches 334 that are turned on.

Additionally, as shown in FIG. 3, the n-bit digital to analog converter 300 also includes a first delay circuit 320 and a second current generation circuit 340. The first delay circuit 320 is coupled to the receiving circuit 310 to receive the first bit signal stream (e.g., Sp0<0>, Sp0<1>, . . . , Sp0<6> and/or a complementary version thereof Sn0<0>, Sn0<1>, . . . , Sn0<6>). The delay circuit 320 generates a second bit signal stream (e.g., Sp1<0>, Sp1<1>, . . . , Sp1<6> and/or a complementary version thereof Sn1<0>, Sn1<1>, . . . , Sn1<6>) representing a version of the first bit signal stream delayed by a first period of time (e.g., corresponding to a clock period). For example, Sp1<0> is delayed relative to Sp0<0> by one clock period, Sp5<0> is delayed relative to Sp5<0> by one clock period, and so on. In some embodiments, the first delay circuit 320 comprises a second set of n memory elements. Each memory element of the second set is coupled to a corresponding memory element of the first set to receive and store a bit value in one of n sub-streams of the first bit signal stream and to produce a delayed version thereof.

The n-bit digital to analog converter 300 further comprises a second current generation circuit 340 coupled to the delay circuit 320 to receive the second bit signal stream (e.g., Sp1<0>, Sp1<1>, . . . , Sp1<6> and/or a complementary version thereof Sn1<0>, Sn1<1>, . . . , Sn1<6>). The second current generation circuit 340 is configured to provide second current $I_B$ to the first output responsive to receiving the second bit signal stream. In other words, 340-0 provides current $I_0$ to Doutp when Sn1<0> is logic 1, 340-5 provides current $I_5$ to Doutp when Sn1<5> is logic 1, and so on.

In some embodiments, the second current generation circuit 340 comprises a second set of n current sources 342-0 through 342-6 (hereinafter collectively referred to as "the second set of current sources 342") and a second set of n switches 344-0 through 344-6 (hereinafter collectively referred to as "the second set of switches 344"). Each current source of the second set of current sources 342 (including current source 342-0, 342-1, and so on) is coupled to the first output (e.g., Doutp) via a corresponding switch of the second set of switches 344 (including switch 344-1, 344-2, and so on), the corresponding switch turned on or off responsive to receiving the bit value in one of n sub-streams of the second bit signal (e.g., Sp1<0>, Sp1<1>, . . . , Sp1<6> and/or a complementary version thereof Sn1<0>, Sn1<1>, . . . , Sn1<6>).

As illustrated in FIG. 3, since the second current is provided to the first output responsive to the second bit signal stream, which is a delayed representation of the first bit signal stream (by a first period of time), the waveform of the second current is also delayed relative to the waveform of the first current by the first period of time, as described below in detail with reference to FIG. 4.

Also, as shown in FIG. 3, the n sub-streams of the second bit signal (Sn1<0>, Sn1<1>, . . . , Sn1<6>) that drive the second set of switches 344 are inverted (e.g., complementary) relative to the n sub-streams of the first bit signal (e.g., Sp0<0>, Sp0<1>, . . . , Sp0<6>) that drive the first set of switches 334. In effect, the control signal polarity of first current generation circuit 330 and that of the second current generation circuit 340 are inverted. As a result, a waveform of the second current is inverted relative to a waveform of the first current.

In some embodiments, the first output is measured as a voltage drop across resistor $R_1$ present along the first and second current flow paths. Resistor R1 can be integrated into a chip with the other components of the DAC, or can be configured or connected external to the chip.

As a result, a waveform of the second current is scaled relative to a waveform of the first current. In other words, a ratio of current provided by current source 342-0 relative to current provided by current source 332-0 has a value of k; a ratio of current provided by current source 342-5 relative to current provided by current source 332-5 has a scaling factor of k; a ratio of current provided by current source 342-6 relative to current provided by current source 332-6 has a value of k; and so on. In some embodiments, the waveform of the second current is down-scaled (e.g., by a factor of 'k,' where k<0) relative to the waveform of the first current. In alternative embodiments (as will be explained with reference to FIG. 5), the waveform of the second current is up-scaled (e.g., by a factor of '1/k,' where k<0) relative to the waveform of the first current. In some embodiments, the scaling factor 'k' is a predetermined constant. In alternative embodiments, the scaling factor 'k' is variable or programmable.

As explained with reference to FIG. 1, each current source of the first set of n current sources 332 is configured to provide a specified value of current (illustrated as $I_0$, . . . , $I_5$, and $I_6$). Current values of consecutive current sources of the first set of current sources have binary relationships. In other words, if $I_0$ is a current value for current source 332-0 corresponding to a least significant bit stream (D<0> or Sp0<0>) of the DAC, then current value $I_1 = 2^1 * I_0 = 2 * I_0$ for the subsequent bit sub-stream of the DAC, . . . , current value $I_5 = 2^5 * I_0 = 32 * I_0$, current value $I_6 = 2^6 * I_0 = 64 * I_0$, and so on. In general, current value $I_n$ for an $n^{th}$ bit of the DAC would be $I_n = 2^n * I_0$. In this example, current values for corresponding current sources of the second set of current sources 342 are $k*I_0$, $k*I_1 = k*2^1*I_0 = 2*I_0$, . . . , $I_5 = 2^5 * I_0 = 32 * I_0$, $I_n = 2^n * I_0 = 64 * I_0$, and so on.

In some embodiments, the n-bit digital to analog converter 300 produces a differential output (e.g., Doutp−Doutn). In such embodiments, the n-bit digital to analog converter 300 comprises a second output (e.g., Doutn) to receive the third current $I_C$ from the first current generation circuit 330 and the fourth current $I_D$ from the second current generation circuit 340. The current at the second output (e.g., Doutn) in conjunction with a current at the first output (e.g., Doutp) forms a differential signal. A third set switches 336-0 through 336-6 (hereinafter collectively referred to as "the third set of switches 336") and couple or decouple the third current source to and from the second output (e.g., Doutn), as shown in FIG. 3. Similarly, fourth set switches 346-0 through 346-6 (hereinafter collectively referred to as "the fourth set of switches 346") and couple or decouple the fourth current source to and from the second output (e.g., Doutn). The first current and third current are mutually inverse by virtue of being activated via complimentary bit streams Sp0 and Sn0. Similarly, the second current and fourth current are mutually inverse by virtue of being activated via complimentary bit streams Sp1 and Sn1.

The DAC 300 of FIG. 3 provides compensation for the sinc attenuation at higher frequencies by emphasizing the higher frequency signal content—in effect, by providing a first order high pass filter response. This first order high pass filter operation can be explained in the Z-domain as follows.

For simplicity, consider a single ended output measured at the first output (Doutp) and consider a single input bit sub-stream D<0> corresponding to the LSB of the input bit stream. The second sub-stream Sp1<0> is delayed relative to first sub-stream Sp0<0> by a first time period (e.g., one clock cycle period). Thus, a first sub-stream Sp0<0> and a second sub-stream Sp1<0> can be represented as:

$$Sp0<0>=x[n] \tag{5}$$

$$Sp1<0>=x[n-1] \tag{6}$$

Since current $I_0$ from the first current generation circuit 330 is provided to the first output Doutp responsive to receiving Sp0<0> and current $k*I_0$ from the second current generation circuit 340 is provided to the first output Doutp responsive to receiving Sp0<0>, the first output Doutp is given by:

$$y[n]=x[n]-k*x[n-1] \tag{7}$$

Thus, the Z-transform of the input Sp0<0> is X(z) and the Z-transform of the output signal Doutp is:

$$Y(z)=(1-k*z^{-1})*X(z) \tag{8}$$

In this case, the Z-domain transfer function is:

$$H(z)=(1-k*z^{-1}) \tag{9}$$

Figure 7:
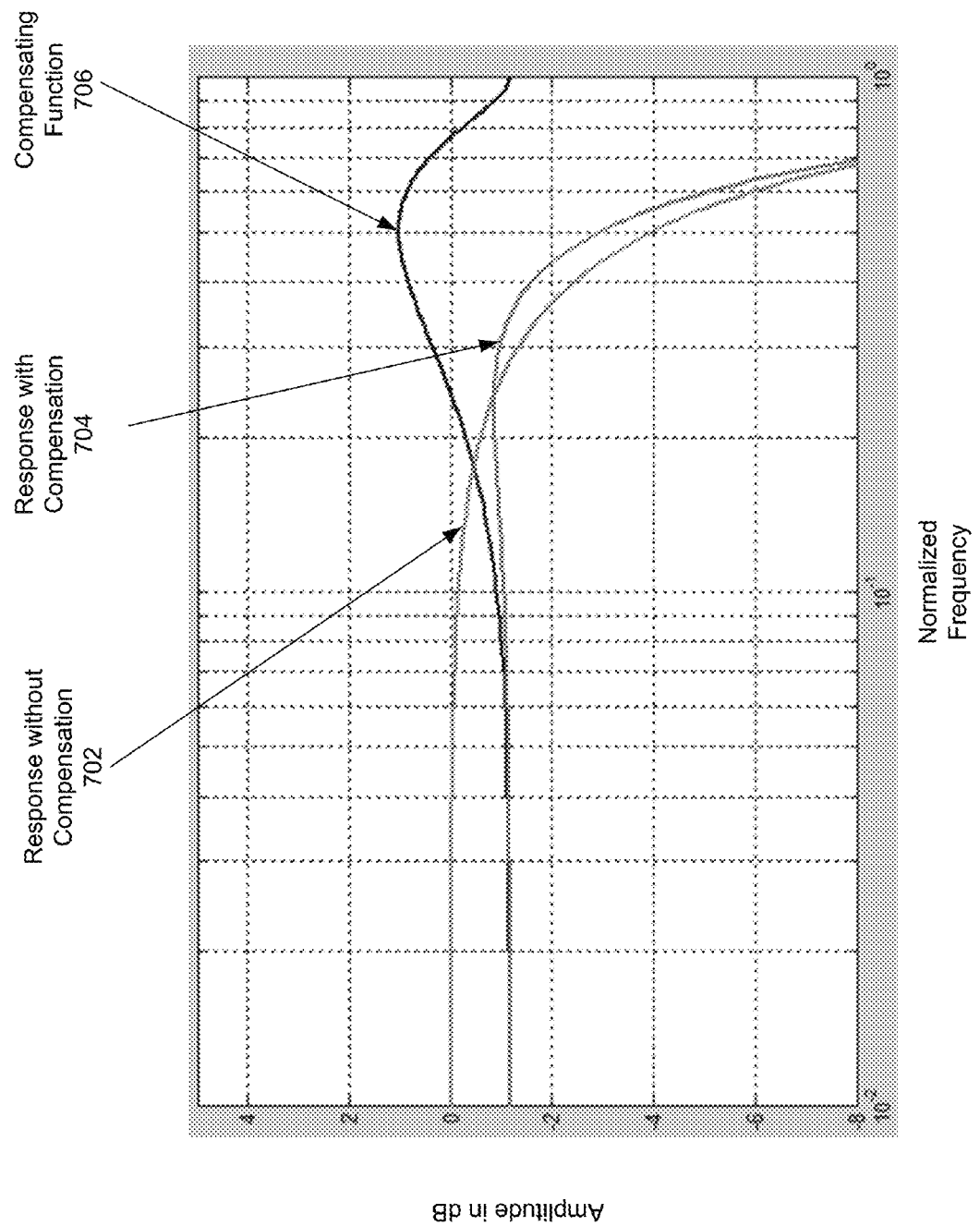
FIGS. 7 and 8 are frequency response plots illustrating various operating principles of the implementations of the current steering digital to analog converters shown in FIG. 3 and FIG. 5, respectively, according to some embodiments.

The transfer function H(z) corresponds to a transfer function of a first order high pass filter with a frequency response 706 shown in FIG. 7.

For a differentially measured output, where Doutn=−Doutp, Doutp=x[n]−k*x[n−1] and Doutn=−{x[n]−k*x[n−1]}. The output differential output is:

$$y[n]=2*\{x[n]-k*x[n-1]\} \tag{10}$$

The Z-transform of the differential output is:

$$Y(z)=2*(1-k*z^{-1})*X(z) \tag{11}$$

In this case, the input signal is also measured differentially between Sp0<0> and Sn0<0>. For Sp0=x[n], as shown in equation (1):

$$Sn0<0>=-x[n] \quad (12)$$

Similarly, for Sp1<0>=x[n−1] as shown in equation (6):

$$Sn1<0>=-x[n-1] \quad (13)$$

Thus, the differential input would be 2*x[n] and a corresponding Z-transform of the differential input is 2*X(z). Thus, in this case, as well, the Z-domain transfer function is also given by:

$$H(z)=(1-k*z^{-1}) \quad (14)$$

The transfer function shown in equation (14) for a differential output and differential input, is the same as the transfer function of the single ended output and single ended input described in equation (9). Thus, the transfer function of equation (13) also represents a first order high pass filter and is represented in the frequency domain as frequency response 706 shown in FIG. 7.

Figure 4:
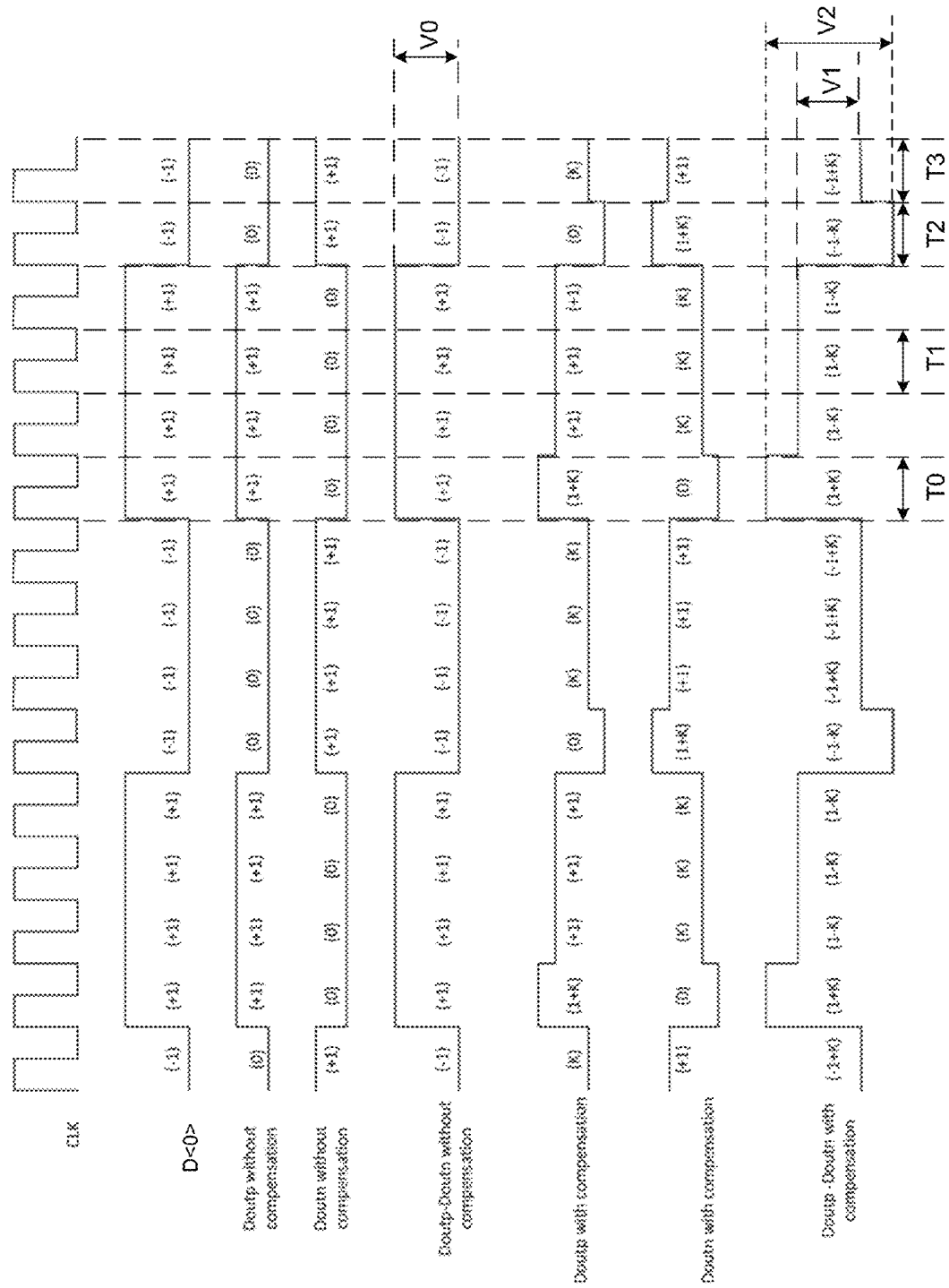
FIG. 4 is a diagram illustrating timing waveforms of the current steering digital to analog converter shown in FIG. 3.

FIG. 4 is a diagram illustrating timing waveforms of the current steering digital to analog converter shown in FIG. 3, according to some embodiments. The signals illustrated in FIG. 4 include the DAC sampling clock signal (CLK) and a current digital input signal for a bit sub-stream of the DAC input bit stream (e.g., LSB sub-stream D<0>). Furthermore, for visual comparison and to illustrate the effect of compensation of the various DAC output signals responsive to the same digital input bit sub-stream, FIG. 4 includes timing waveforms of the DAC output signals, with and without compensation. In other words, FIG. 4 illustrates the first output (Doutp) without compensation, the second output (Doutn) without compensation, and the differential output (Doutp−Doutn) without compensation in response to receiving signal D<0>; FIG. 4 also illustrates the first output (Doutp) with compensation, the second output (Doutn) with compensation, and the differential output (Doutp−Doutn) with compensation in response to receiving the same signal D<0>. In each case—with and without compensation—Doutp and Doutn are complementary.

In particular, to highlight or illustrate the effect, in the time domain, of the compensation response of DAC 300 on high frequency signal content in the digital input bit sub-stream D<0>, consider the effect of bit transitions in D<0> which contain high frequency signal content, on the differential output signal (Doutp−Doutn) with and without compensation. In particular, consider the effect of two opposite bit transitions from logic 1 to logic 0 corresponding to a falling edge of D<0> and logic 0 to logic 1 corresponding to a rising edge of D<0>.

Without compensation, responsive to an input bit transition, the differential output simply toggles between two states (from −1 to +1 for example during time T0; or from +1 to −1 during time T2; resulting in a peak-to-peak difference of 2 units or V0). In the absence of a transition, the differential signal maintains its previous bit value (+1 for example during time T1; or −1 during time T3; resulting in a peak-to-peak difference of 2 units or V0). Thus a peak-peak difference between output levels of the differential signal, with or without a transition, is substantially identical and is shown as V0 in FIG. 4.

In contrast, as illustrated with reference to the differential output signal Doutp−Doutn with compensation, responsive to an input bit transition, the differential output is equal to a value of a first pair of values (+1+K for example during time T0; or −1−K during time T2; resulting in a peak-to-peak difference between these two values emphasized to 2*(1+K) or V2). In the absence of a transition, the differential output is equal to a value of a second pair of values (1−K for example during time T1; or −1+K during time T3; resulting in a peak-to-peak difference of 2*(1−K) or V1). This emphasis in peak-to-peak difference between V2 and V1, with compensation, results in a boost in higher frequency signal content.

Note that, as explained above, the first time period may correspond to a period of the clock (CLK) cycle (e.g., the duration of T0, T1, T2, T3).

Referring to FIG. 7, in the frequency domain, this emphasis in a difference between V2 and V1 results in a boost in frequency signal content (as illustrated by the compensating function 706 in FIG. 7). Accordingly, as shown in FIG. 7, a resulting frequency response with compensation 704 has a flatter response at higher frequencies than does the response without compensation 702.

In some embodiments, the DAC of FIG. 3 is modified to include one or more additional delay circuits and one or more corresponding additional current generation circuits, thus providing a higher order high pass filter response (e.g., a more flat response at the high signal frequencies). For example, a second order filter $Y(z)=1-0.125*z^{-1}+0.0125*z^{-2}$, the compensation result can reach 0.092 dB flatness. In such embodiments, for each additional current generation circuit, a current scaling constant for the current source is scaled by progressively reduced scaling constants. In the example of the second order filter $Y(z)=1-0.125*z^{-1}+0.0125*z^{-2}$, $K_1=0.125$ and the subsequent current scaling constant $K_2=0.0125$.

Stated differently, to achieve the higher order filter compensation (second, third, fourth order and so on), the n-bit digital to analog converter may further comprise one or more additional delay circuits coupled to the first delay circuit. The filter order achieved by the addition of delay circuits is equal to the number of delay circuits added. For example, one delay circuit (as in the example of FIG. 3) results in a first order high pass filter, two delay circuits result in a second order high pass filter, three delay circuits result in a third order high pass filer, and so on. The one or more additional delay circuits are configured to generate a third bit signal stream representing a version of the first bit signal stream delayed relative to the input bit stream by a second period of time (e.g., two clock cycles) that is greater than the first period of time (e.g., one clock cycle). Furthermore, the n-bit digital to analog converter comprises one or more corresponding additional current generation circuits coupled to the one or more additional delay circuits to receive the third bit signal stream and to provide a third current to the first output responsive to receiving the third bit signal stream, a waveform of the third current scaled relative to a waveform of the first current. In the case of higher filter orders, for example in the case of a fourth order filter implementation comprising first, second, third, fourth delay circuits and correspondingly a first, second, third, fourth current generation circuits, current provided by even order current generation circuits (e.g., the second and fourth circuits) is of like polarity (mutually reinforce); current provided by the odd order current generation circuits (e.g., the first and third circuits) is of like polarity (mutually reinforce). Odd and even order current generation circuits are of opposite polarity (e.g., deemphasize each other).

Figure 5:
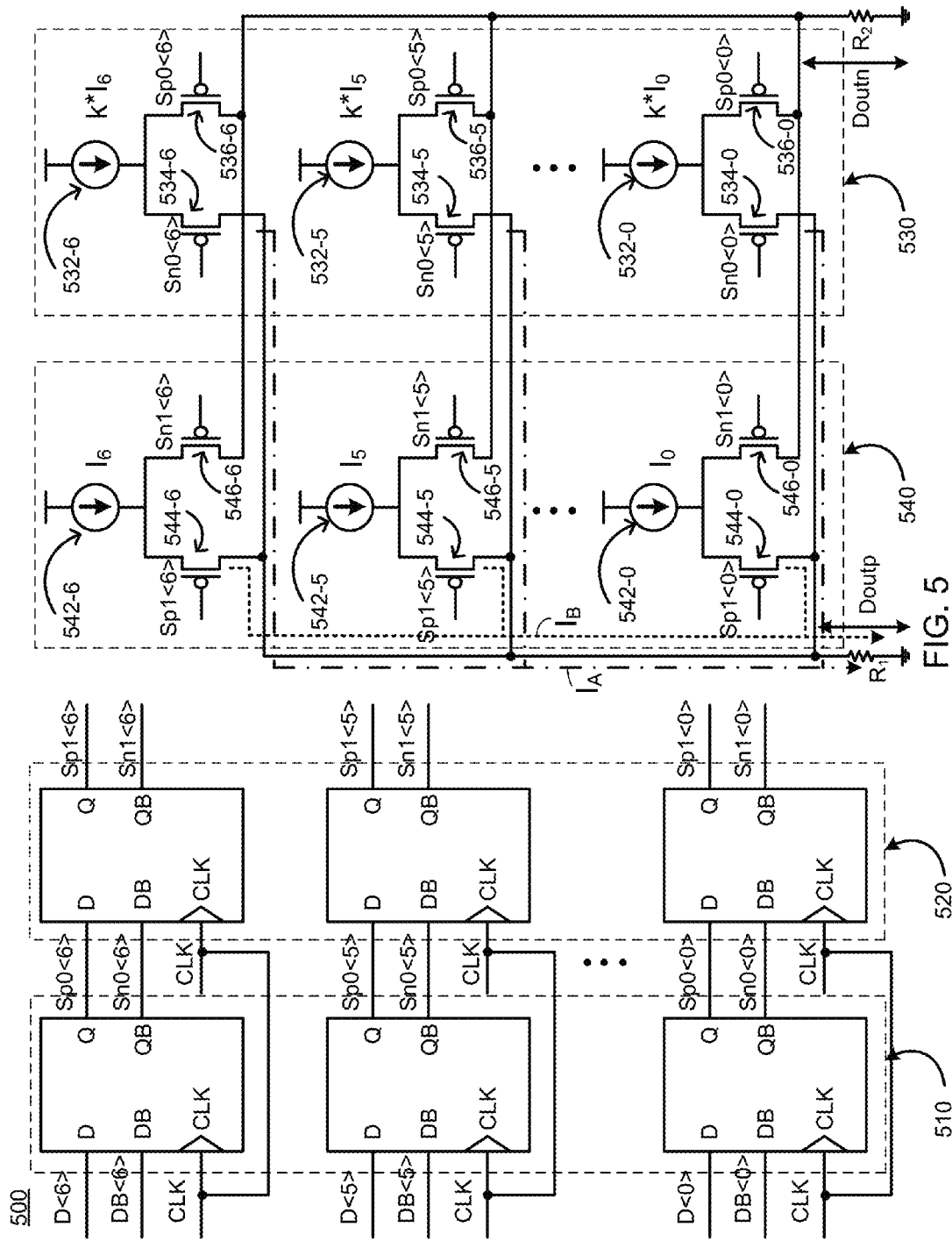
FIG. 5 is a circuit schematic illustrating a current steering digital to analog converter with frequency response compensation, according to another embodiment.

FIG. 5 is a circuit schematic illustrating a current steering digital to analog converter (DAC) 500 with frequency response compensation, according to some embodiments. DAC 500 includes a receiving circuit 510 and a first current generation circuit 530—the receiving circuit 510 and first current generation circuit 530 are substantially the same as receiving circuit 110 and current generation circuit 130 of FIG. 1 except that the n-bit digital to analog converter 500 also includes first delay circuit 520 and second current generation circuit 540. Furthermore, the receiving circuit 510, first delay circuit 520, first current generation circuit 530, and second current generation circuit 540 are substantially the same as receiving circuit 310, first delay circuit 320, first current generation circuit 330, and second current generation circuit 340, respectively, except that the waveform of the second current from the second current generation circuit 540 in the embodiment of FIG. 5 is up-scaled (e.g., by a factor of '1/k,' where k<0) relative to the waveform of the first current from the first current generation circuit 530.

The first current generation circuit 530 comprises a first set of n current sources 532-0 through 532-5 (hereinafter collectively referred to as "the first set of current sources 532") and a first set of n switches 534-0 through 534-5 (hereinafter collectively referred to as "the first set of switches 534"). The second current generation circuit 540 comprises a second set of n current sources 542-0 through 542-5 (hereinafter collectively referred to as "the second set of current sources 542") and a second set of n switches 544-0 through 544-5 (hereinafter collectively referred to as "the second set of switches 544"). The first set of n current sources 532, the first set of n switches 534, the second set of n current sources 542 (including current source 542-0, 542-1, and so on) and a second set of n switches 544 (including switch 544-0, 544-1, and so on), may share one or more attributes, respectively, of the first set of n current sources 332, the first set of n switches 334, the second set of n current sources 342 (including current source 342-0, 342-1, and so on) and a second set of n switches 344 (including switch 344-0, 344-1, and so on).

However, in contrast to the embodiment of FIG. 3, the waveform of the second current $I_B$ in the embodiment of FIG. 5 is up-scaled (e.g., by a factor of '1/k,' where k<0) relative to the waveform of the first current $I_A$. This configuration results a different filter transfer function as compared to the transfer function of the configuration illustrated in FIG. 3, as explained below with reference to equations (15) through (20).

For simplicity, again, consider a single ended output measured at output Doutp and consider a single input bit substream D<0> corresponding to the LSB of the input bit stream. Further, consider a first sub-stream Sp0<0>=x[n] (same as in equation 5) and its complementary signal Sn0<0>=−x[n] (as in equation 10) corresponding to the input bit sub-stream D<0>. The second sub-stream Sp1<0> is delayed relative to first sub-stream Sp0<0> by a first time period (e.g., one clock cycle period). Thus, the second sub-stream Sp1<0>=x[n−1] (as in equation 6) and its complimentary signal Sn1<0>=−x[n−1] (as in equation 13).

Since current k*$I_0$ from the first current generation circuit 530 is provided to the first output Doutp responsive to Sn0<0> and current $I_0$ from the second current generation circuit 540 is provided to the first output Doutp responsive to Sp1<0>, the first output Doutp is given by:

$$y[n]=x[n-1]-k*x[n] \quad (15)$$

Thus, the Z-transform of the input Sp1<0> is $z^{-1}*X(z)$ and the Z-transform of the output signal Doutp is $$Y(z)=(z^{-1}-k)*X(z) \quad (16)$$

In this case, the Z-domain transfer function is given by:

$$H(z)=(z^{-1}-k)/z^{-1}=(1-kz) \quad (17)$$

The transfer function H(z) corresponds to a transfer function of a first order high pass filter with a frequency response 706 shown in FIG. 7. The frequency response of this transfer function of substantially identical to the transfer function (equation 9 or 14) of the configuration described with reference to DAC 300 of FIG. 3.

For a differentially measured output, where Doutn=−Doutp, Doutp=x[n−1]−k*x[n] and Doutn=−{x[n−1]−k*x[n]}. The differential output is:

$$y[n]=2*\{x[n-1]-k*x[n]\} \quad (18)$$

The Z-transform of the output is:

$$Y(z)=2*(z^{-1}-k)*X(z) \quad (19)$$

In this case, the input signal is also measured differentially between Sp1<0> and Sn1<0>. For Sp0=x[n], Sn0=−x[n]; Sp1 is x[n−1] and Sn1 is −x[n−1]. Thus, the differential input would be 2*x[n−1] and a corresponding Z-transform of the differential input is $2*z^{-1}*X(z)$. Thus, in this case, as well, the Z-domain transfer function is:

$$H(z)=(1-kz) \quad (20)$$

Thus, the transfer function of equation 13 also represents a first order high pass filter and is represented in the frequency domain as frequency response 706 shown in FIG. 7. The frequency response of this transfer function of substantially identical to the transfer function (equation (9) or (14)) of the configuration described with reference to DAC 300 of FIG. 3.

Figure 6:
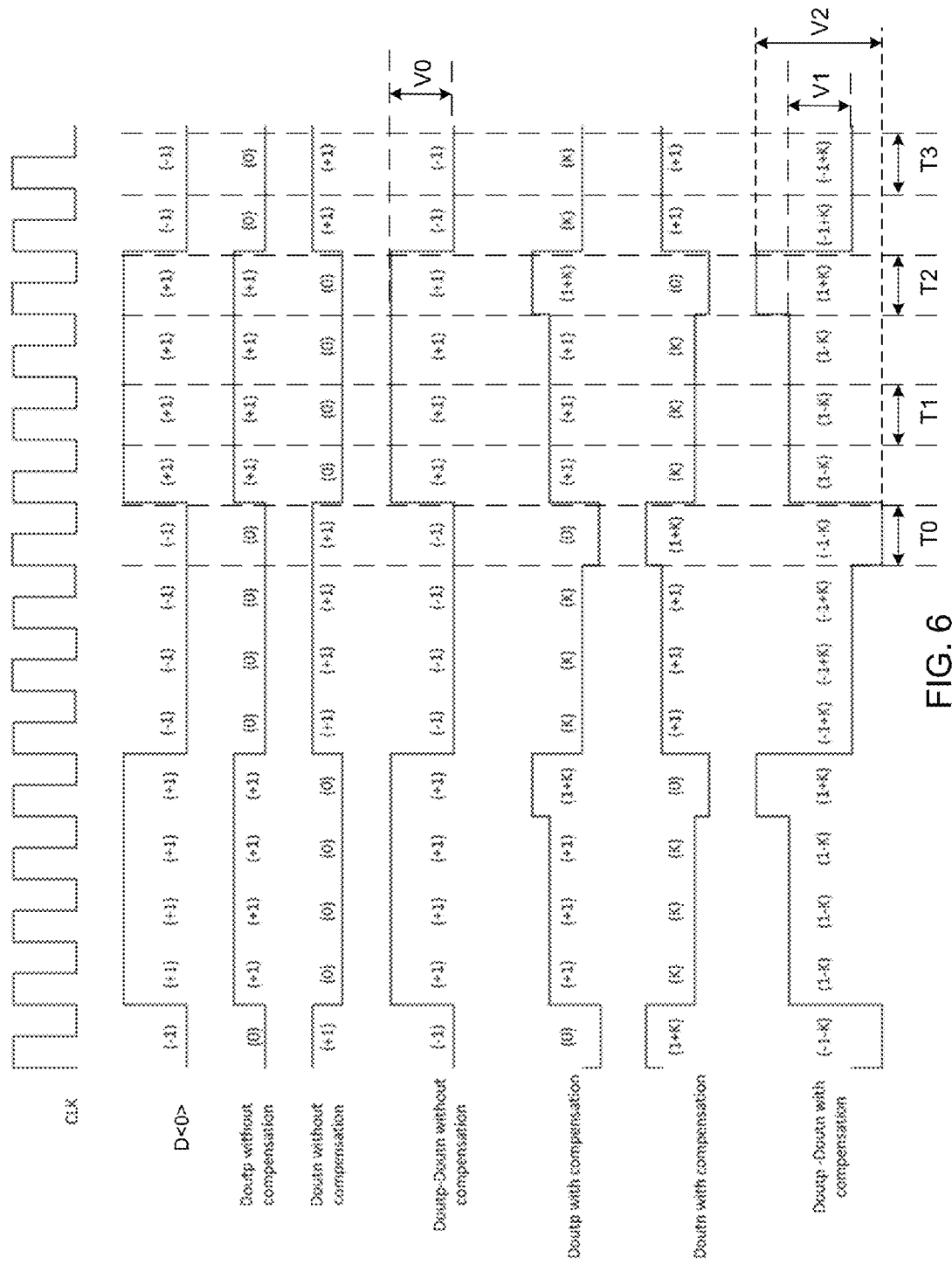
FIG. 6 is a diagram illustrating timing waveforms of the current steering digital to analog converter of FIG. 5.

FIG. 6 includes timing waveforms illustrating various operating principles of the second implementation of the current steering digital to analog converter shown in FIG. 5, according to some embodiments.

As illustrated with reference to the differential output signal Doutp−Doutn with compensation, responsive to an input bit transition, the differential output is equal to a value of a first pair of values (−1−K for example during time T0; or +1+K during time T2; resulting in a peak-to-peak difference between these two values emphasized to 2*(1+K) or V2). In the absence of a transition, the differential output is equal to a value of a second pair of values (1−K for example during time T1; or −1+K during time T3; resulting in a peak-to-peak difference of 2*(1−K) or V1). This emphasis in the peak-to-peak difference between during and in the absence of a transition (difference between V2 and V1), with compensation, results in a boost in higher frequency signal content.

Figure 8:
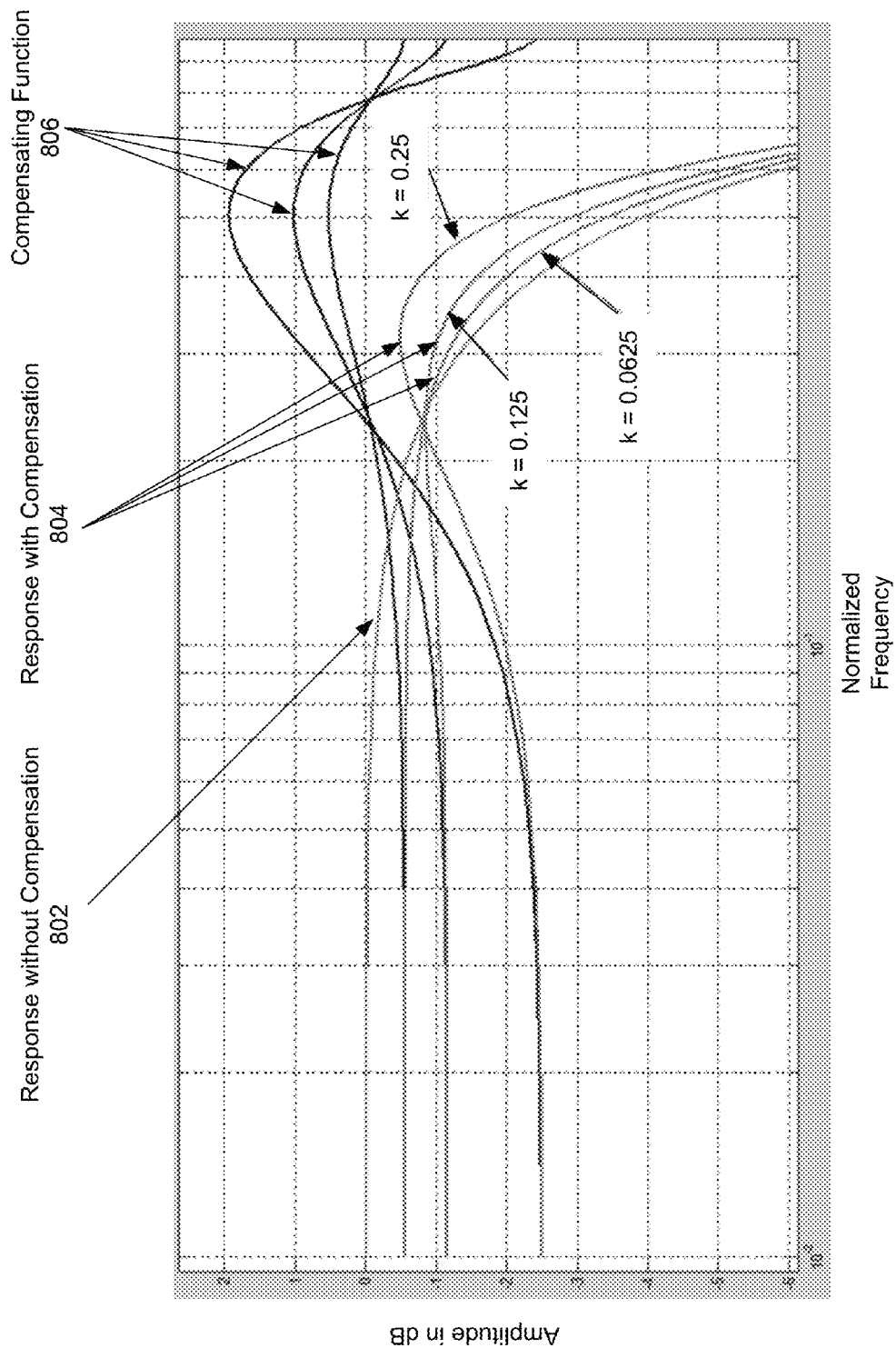

FIGS. 7 and 8 are frequency response plots illustrating various operating principles of the implementations of the current steering digital to analog converters shown in FIG. 3 and FIG. 5, respectively, according to some embodiments. FIG. 7 illustrates DAC's output spectrum envelope without 702 and with 704 compensation, as well as the compensating function 706. For a current scaling constant (k) of 0.125, the attenuation at frequency ⅓$F_s$ is reduced from 1.65 dB to 0.08 dB by the addition of the compensation circuit and the response with compensation exhibits 0.3 dB flatness up to ⅓$F_s$. At the lower signal frequencies, the SNR is reduced by 1 dB compared with the SNR without compensation.

FIG. 8 illustrates three families of frequency responses—without compensation 802, with compensation 804, and the compensating function itself 806 to illustrate the effect of the current scaling factor (k) on the frequency response of the compensating high pass filter. One or more properties of the high pass filter vary with the value of the current scaling factor (k). For example, the flatness specification in pass band, attenuation at high frequencies, extent of compensation (e.g., overcompensated, critically or optimally compensated, or undercompensated), frequency overshoot or undershoot at the high frequencies, and the like. Factors that affect the choice of the scaling factor k include signal pass band, the flatness requirement in pass band, circuit implementation (cost, implementation feasibility and ease), current bias matching effect, die size, power consumption, and the like. FIG. 8 illustrates frequency responses for three values of k (0.0625, 0.125, and 0.25).

By increasing the value of k, the system progressively varies from undercompensated (k=0.0625), to critically or optimally compensated (e.g., k=0.125), to overcompensated (k=0.25). As other examples, for a first order filter, for k=⅕, flatness up to ⅓Fs is 0.179 dB; for k=¹⁄₁₀, flatness up to ⅓Fs is 0.2765 dB.

Figure 9:
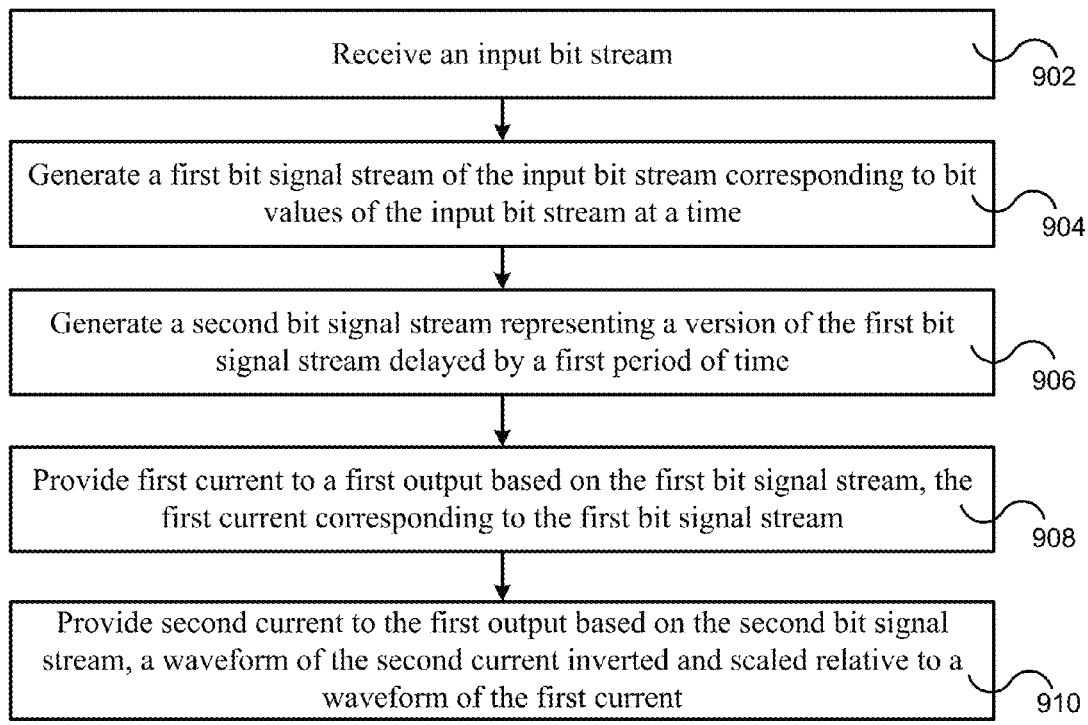
FIG. 9 is a flowchart illustrating a method of operating an n-bit digital to analog converter (DAC) with frequency response compensation, according to one embodiment.

FIG. 9 is a flowchart illustrating a method of operating an n-bit digital to analog converter (DAC) with frequency response compensation, according to one embodiment.

First, an input bit stream (e.g., an n-bit digital bit stream) is received 902 at the DAC. A first bit signal stream of the input bit stream corresponding to bit values of the input bit stream at a time is generated 904.

A second bit signal stream representing a version of the first bit signal stream delayed by a first period of time is generated 906. First current is provided 908 to a first output based on the first bit signal stream. The first current corresponds to the first bit signal stream.

Second current is provided 910 to the first output based on the second bit signal stream. The waveform of the second current is inverted and scaled relative to a waveform of the first current. In some embodiments, the first output or a representation thereof corresponds to an analog output corresponding to the input bit stream.

Although FIG. 9 illustrates providing 908 the first current is followed by providing 910 the second current, in practice, the first current and the second current is provided at substantially the same time.

Figure 10:
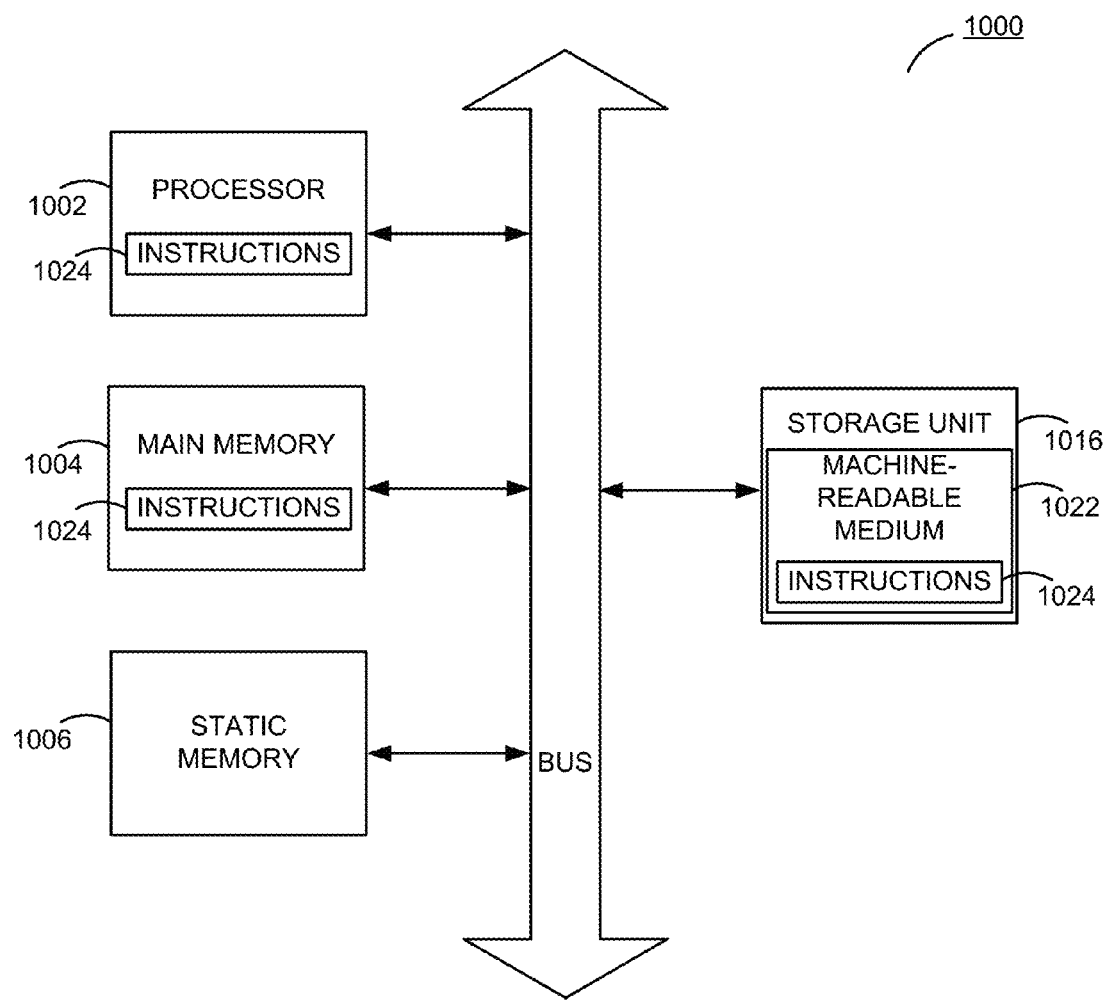
FIG. 10 illustrates a computer system for storing a digital representation of a DAC with frequency response compensation in memory, according to one embodiment.

FIG. 10 is a computer system for storing a digital representation of a DAC with frequency response compensation in memory, according to one embodiment. The computer system 1000 operates as a standalone device or may be connected (e.g., networked) to other machines. In a networked deployment, the computer system 1000 may operate in the capacity of a server machine or a client machine in a server-client network environment, or as a peer machine in a peer-to-peer (or distributed) network environment.

The example computer system 1000 includes a processor 1002 (e.g., a central processing unit (CPU), a graphics processing unit (GPU), a digital signal processor (DSP), one or more application specific integrated circuits (ASICs), a main memory 1004, a static memory 1006, and a storage unit 1016 which are configured to communicate with each other via a bus 1008. The storage unit 1016 includes a machine-readable medium 1022 on which is stored instructions 1024 (e.g., software) embodying any one or more of the methodologies or functions described herein. The instructions 1024 (e.g., software) may also reside, completely or at least partially, within the main memory 1004 or within the processor 1002 (e.g., within a processor's cache memory) during execution thereof by the computer system 1000, the main memory 1004 and the processor 1002 also constituting machine-readable media. The main memory 1004, the static memory 1006, and the storage unit 1016 may store digital representation of the DAC explained above with reference to FIG. 3 through FIG. 8. The representation of the DAC may, for example, be described in hardware description languages (HDLs) such as Verilog or VHDL. register-transistor level (RTL) or GDS II format.

The main memory 1004, the static memory 1006, and the storage unit 1016 may also store code for executing electronic design automation (EDA) operations such as synthesis and verification to make various use of the representation of the DAC described herein.

While machine-readable medium 1022 is shown in an example embodiment to be a single medium, the term "machine-readable medium" should be taken to include a single medium or multiple media (e.g., a centralized or distributed database, or associated caches and servers) able to store instructions (e.g., instructions 1024). The term "machine-readable medium" shall also be taken to include any medium that is capable of storing instructions (e.g., instructions 1024) for execution by the machine and that cause the machine to perform any one or more of the methodologies disclosed herein. The term "machine-readable medium" includes, but not be limited to, data repositories in the form of solid-state memories, optical media, and magnetic media.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications.

What is claimed is:

1. An n-bit digital to analog converter comprising:
   a receiving circuit configured to receive an input bit stream and generate a first bit signal stream of the input bit stream corresponding to bit values of the input bit stream at a time;
   a first delay circuit coupled to the receiving circuit to receive the first bit signal stream, the delay circuit configured to generate a second bit signal stream representing a version of the first bit signal stream delayed by a first period of time;
   a first current generation circuit coupled to the receiving circuit to receive the first bit signal stream, the first current generation circuit configured to provide first current to a first output responsive to receiving the first bit signal stream, the first current corresponding to the first bit signal stream; and
   a second current generation circuit coupled to the delay circuit to receive the second bit signal stream, the second current generation circuit configured to provide second current to the first output responsive to receiving the second bit signal stream, a waveform of the second current inverted and scaled relative to a waveform of the first current.

2. The n-bit digital to analog converter of claim 1, wherein the waveform of the second current lags the waveform of the first current by the first period of time.

3. The n-bit digital to analog converter of claim 1, wherein:
   the receiving circuit comprises a first set of n memory elements, each memory element of the first set configured to receive and store a bit value in one of n substreams of the input bit stream; and
   the first delay circuit comprises a second set of n memory elements, each memory element of the second set coupled to a corresponding memory element of the first set to receive and store a bit value in one of n sub-streams of the first bit signal stream.

4. The n-bit digital to analog converter of claim 3, wherein the first current generation circuit comprises a first set of n current sources and a first set of n switches, each current source of the first set of current sources coupled to the first output via a corresponding switch of the first set of switches, the corresponding switch turned on or off responsive to the bit value in one of n sub-streams of the first bit signal stream.

5. The n-bit digital to analog converter of claim 3, wherein the second current generation circuit comprises a second set of n current sources and a second set of n switches, each current source of the second set of current sources coupled to the first output via a corresponding switch of the second set of switches, the corresponding switch turned on or off responsive to the bit value in one of n sub-streams of the second bit signal.

6. The n-bit digital to analog converter of claim 1, further comprising:
one or more additional delay circuits coupled to the first delay circuit and configured to generate a third bit signal stream representing a version of the first bit signal stream delayed relative to the input bit stream by a second period of time that is greater than the first period of time; and
one or more corresponding additional current generation circuits coupled to the one or more additional delay circuits to receive the third bit signal stream and to provide a third current to the first output responsive to receiving the third bit signal stream, a waveform of the third current scaled relative to a waveform of the first current.

7. The n-bit digital to analog converter of claim 1, further comprising a second output to receive a third current from the first current generation circuit and a fourth current from the second current generation circuit, a current at the second output in conjunction with a current at the first output forming a differential signal.

8. The n-bit digital to analog converter of claim 1, wherein the waveform of the second current is up-scaled relative to the waveform of the first current.

9. The n-bit digital to analog converter of claim 1, wherein the waveform of the second current is down-scaled relative to the waveform of the first current.

10. A method of operating an n-bit digital to analog converter, the method comprising:
receiving an input bit stream;
generating a first bit signal stream of the input bit stream corresponding to bit values of the input bit stream at a time;
generating a second bit signal stream representing a version of the first bit signal stream delayed by a first period of time;
providing first current to a first output based on the first bit signal stream, the first current corresponding to the first bit signal stream; and
providing second current to the first output based on the second bit signal stream, a waveform of the second current inverted and scaled relative to a waveform of the first current.

11. The method of claim 10, further comprising:
generating a third bit signal stream representing a version of the first bit signal stream delayed relative to the input bit stream by a second period of time that is greater than the first period of time; and
providing a third current to the first output responsive to receiving the third bit signal stream, a waveform of the third current scaled relative to a waveform of the first current.

12. The method of claim 10, further comprising:
providing a third current to a second output responsive to a representation of the first bit signal stream;
providing a fourth current to the second output responsive to a representation of the second bit signal stream; and
generating a differential signal based on a current at the second output in conjunction with a current at the first output.

13. A non-transitory computer readable medium storing a representation of an n-bit digital to analog converter, the n-bit digital to analog converter comprising:
a receiving circuit configured to receive an input bit stream and generate a first bit signal stream of the input bit stream corresponding to bit values of the input bit stream at a time;
a first delay circuit coupled to the receiving circuit to receive the first bit signal stream, the delay circuit configured to generate a second bit signal stream representing a version of the first bit signal stream delayed by a first period of time;
a first current generation circuit coupled to the receiving circuit to receive the first bit signal stream, the first current generation circuit configured to provide first current to a first output responsive to receiving the first bit signal stream, the first current corresponding to the first bit signal stream; and
a second current generation circuit coupled to the delay circuit to receive the second bit signal stream, the second current generation circuit configured to provide second current to the first output responsive to receiving the second bit signal stream, a waveform of the second current inverted and scaled relative to a waveform of the first current.

14. The non-transitory computer readable medium of claim 13, wherein the waveform of the second current lags the waveform of the first current by the first period of time.

15. The non-transitory computer readable medium of claim 13, wherein:
the receiving circuit comprises a first set of n memory elements, each memory element of the first set configured to receive and store a bit value in one of n sub-streams of the input bit stream; and
the first delay circuit comprises a second set of n memory elements, each memory element of the second set coupled to a corresponding memory element of the first set to receive and store a bit value in one of n sub-streams of the first bit signal stream.

16. The non-transitory computer readable medium of claim 15, wherein the first current generation circuit comprises a first set of n current sources and a first set of n switches, each current source of the first set of current sources coupled to the first output via a corresponding switch of the first set of switches, the corresponding switch turned on or off responsive to the bit value in one of n sub-streams of the first bit signal stream.

17. The non-transitory computer readable medium of claim 15, wherein the second current generation circuit comprises a second set of n current sources and a second set of n switches, each current source of the second set of current sources coupled to the first output via a corresponding switch of the second set of switches, the corresponding switch turned on or off responsive to the bit value in one of n sub-streams of the second bit signal.

18. The non-transitory computer readable medium of claim 13, further comprising:
one or more additional delay circuits coupled to the first delay circuit and configured to generate a third bit signal stream representing a version of the first bit signal stream delayed relative to the input bit stream by a second period of time that is greater than the first period of time; and one or more corresponding additional current generation circuits coupled to the one or more additional delay circuits to receive the third bit signal stream and to provide a third current to the first output responsive to receiving the third bit signal stream, a waveform of the third current scaled relative to a waveform of the first current.

19. The non-transitory computer readable medium of claim 13, further comprising a second output to receive a third current from the first current generation circuit and a fourth current from the second current generation circuit, a current at the second output in conjunction with a current at the first output forming a differential signal.

20. The non-transitory computer readable medium of claim 13, wherein the waveform of the second current is up-scaled or down-scaled relative to the waveform of the first current.

* * * * *